(12) United States Patent
Conn

(10) Patent No.: US 8,008,134 B2
(45) Date of Patent: Aug. 30, 2011

(54) LARGE SUBSTRATE STRUCTURAL VIAS

(75) Inventor: Robert O. Conn, Laupahoehoe, HI (US)

(73) Assignee: Research Triangle Institute, Research Triangle Park, NC (US)

( * ) Notice: Subject to any disclaimer, the term of this patent is extended or adjusted under 35 U.S.C. 154(b) by 0 days.

(21) Appl. No.: 12/798,874

(22) Filed: Apr. 12, 2010

(65) Prior Publication Data

US 2010/0200540 A1 Aug. 12, 2010

Related U.S. Application Data

(63) Continuation of application No. 11/952,495, filed on Dec. 7, 2007, now Pat. No. 7,709,966.

(51) Int. Cl.
*H01L 23/48* (2006.01)
(52) U.S. Cl. .................. 438/128; 438/639; 257/E23.01
(58) Field of Classification Search .................. 257/774, 257/E23.01; 216/17; 427/97.2, 96.9; 29/825; 438/128, 629, 637, 639, 640, 667, 668, 672, 438/675, 700, 701, 713, 750
See application file for complete search history.

(56) References Cited

U.S. PATENT DOCUMENTS

| | | | |
|---|---|---|---|
| 5,172,310 A | 12/1992 | Deam et al. .................. 363/144 |
| 5,208,491 A | 5/1993 | Ebeling et al. .................. 326/41 |
| 5,236,118 A | 8/1993 | Bower et al. .................. 228/193 |
| 5,511,428 A | 4/1996 | Goldberg et al. ............. 731/777 |
| 5,619,071 A * | 4/1997 | Myers et al. .................. 257/753 |
| 5,655,290 A | 8/1997 | Moresco et al. ................. 29/830 |
| 5,790,771 A | 8/1998 | Culbertson et al. ............... 714/3 |
| 5,805,533 A | 9/1998 | Daigle et al. .................. 368/226 |
| 5,834,705 A | 11/1998 | Jonaidi .......... 174/261 |
| 5,891,761 A | 4/1999 | Vindasius et al. ............. 438/109 |
| 5,949,030 A | 9/1999 | Fasano et al. .................. 174/262 |
| 6,096,411 A * | 8/2000 | Nakatani et al. ............. 428/209 |
| 6,206,705 B1 | 3/2001 | Bolotin et al. .................. 439/69 |
| 6,221,769 B1 | 4/2001 | Dhong et al. ................. 438/667 |
| 6,259,160 B1 | 7/2001 | Lopatin et al. ................. 257/762 |
| 6,379,982 B1 | 4/2002 | Ahn et al. ....................... 438/14 |
| 6,555,467 B2 | 4/2003 | Hsu et al. ...................... 438/633 |
| 6,598,216 B2 | 7/2003 | Chan et al. ....................... 716/13 |
| 6,650,301 B1 | 11/2003 | Zimmerman ................. 343/803 |
| 6,660,564 B2 | 12/2003 | Brady .......................... 438/119 |
| 6,694,464 B1 | 2/2004 | Quayle et al. ................. 714/725 |
| 6,768,205 B2 | 7/2004 | Taniguchi et al. ............. 257/774 |
| 7,048,548 B2 | 5/2006 | Mattieu et al. .................. 439/66 |
| 7,409,610 B1 | 8/2008 | Drimer ......................... 714/725 |
| 2002/0134581 A1 | 9/2002 | Figueroa et al. ............. 174/260 |
| 2002/0134685 A1 | 9/2002 | Chakravorty et al. ......... 205/125 |
| 2002/0163062 A1 | 11/2002 | Wang et al. .................... 257/641 |
| 2003/0107117 A1 | 6/2003 | Antonell et al. .............. 257/684 |
| 2004/0038195 A1 | 2/2004 | Nerenberg et al. ............... 435/4 |
| 2004/0179344 A1 | 9/2004 | Uchida et al. ................. 361/777 |
| 2005/0104221 A1 | 5/2005 | Memis .......................... 257/778 |
| 2006/0027934 A1 | 2/2006 | Edelstein et al. ............. 257/774 |

(Continued)

*Primary Examiner* — Roy K Potter
(74) *Attorney, Agent, or Firm* — Imperium Patent Works

(57) ABSTRACT

An electronic package and methods by which the package reduces thermal fatigue failure of conductors in the electronic package. The electronic package includes a carrier substrate having first and second surfaces and a plurality of anchor vias having a via material extending from the first surface toward the second surface. The electronic package includes a first conducting layer having a length and a width extending laterally in two dimensions across a major part of the first surface of the carrier substrate. The anchor vias have plural attachments along the length and the width of the first conducting layer to secure the first conducting layer to the carrier substrate.

17 Claims, 4 Drawing Sheets

U.S. PATENT DOCUMENTS

| | | | |
|---|---|---|---|
| 2006/0125094 A1 | 6/2006 | Lin | 257/734 |
| 2006/0170110 A1 | 8/2006 | Akram et al. | 257/774 |
| 2006/0190846 A1 | 8/2006 | Hichri et al. | 716/1 |
| 2006/0226450 A1 | 10/2006 | Furuta et al. | 257/208 |
| 2007/0012475 A1 | 1/2007 | Kawaguchi et al. | 174/255 |
| 2007/0210400 A1 | 9/2007 | Moribayashi et al. | 257/440 |
| 2008/0054486 A1 | 3/2008 | Murayama et al. | 257/774 |
| 2008/0253085 A1 | 10/2008 | Soffer | 361/687 |

\* cited by examiner

LARGE SUBSTRATE STRUCTURAL VIAS

CROSS REFERENCE TO RELATED APPLICATION

This application is a continuation of, and claims priority under 35 U.S.C. §120 from, nonprovisional U.S. patent application Ser. No. 11/952,495 entitled "Large Substrate Structural Vias," filed on Dec. 7, 2007 now U.S. Pat. No. 7,709,966, the subject matter of which is incorporated herein by reference.

This application is related to the following applications: 1) U.S. Non-Provisional Application entitled "Preventing Breakage of Long Metal Signal Conductors on Semiconductor Substrates," U.S. Ser. No. 11/975,058 filed Oct. 16, 2007; 2) U.S. Non-Provisional Application entitled "Local Defect Memories on Semiconductor Substrates in a Stack Computer," U.S. Ser. No. 11/981,853 filed Oct. 31, 2007; 3) U.S. Non-Provisional Application entitled "Comb-Shaped Power Bus Bar Assembly Structure Having Integrated Capacitors," U.S. Ser. No. 11/975,011 filed Oct. 16, 2007; 4) U.S. Provisional Application entitled "Semiconductor Substrate Stack High Performance Computer," U.S. Ser. No. 60/995,195 filed Sep. 24, 2007; and 5) U.S. Non-Provisional Application entitled "Semiconductor Substrate Elastomeric Stack," U.S. Ser. No. 11/975,007 filed Oct. 16, 2007. The contents of all these applications are incorporated by their entirety herein by reference.

BACKGROUND OF THE INVENTION

1. Field of the Invention

This invention relates to a carrier substrate for mounting of semiconductor chip devices and components where the carrier substrate is resistant to thermal fatigue problems.

2. Discussion of the Background

There is a demand for fast computing devices that require a large amount of power. The large amount of power results in large changes in the temperature of the devices. For example, a part of the device may be at 25° C. when no power is supplied to the device and may reach 100° C. when power is supplied. In addition, these devices can change temperature depending on the level of activity, low and high level of computation in a processor. These extensive and repeated temperature changes cause fatigue of the package and the structure including the package. An electronic package may then fail due to this fatigue. One place where this fatigue occurs is between the layers of a package laminate, or between a packaged part and a PCB (printed circuit board). When one considers building a large area silicon substrate to act as a PCB, it is known by those skilled in the art that the conductors will delaminate or crack due to repeated thermal cycles.

Thus, for fast computing devices that use multiple integrated circuits that are capable of being reprogrammed as necessary during calculations performed by the computing device, the delamination of various layers is present. Standard computing devices include specialized elements that are defined, before being manufactured, to perform one or more functions, as for example dividing or multiplying numbers.

The new computing devices are designed to be reprogrammable, i.e., the functions of the various elements are defined after manufacture, depending on the need of the computing device. These features permit the computing device to reprogram when necessary its elements, resulting in a faster and more compact device. It is estimated that a reprogrammable device achieves a speed from 10 to 100 times faster than a non-programmable device.

However, the new computing devices, by packaging many active elements on a same substrate or multiple substrates stacked together and due to intense computational activity, are producing a large amount of heat that impacts negatively the bonds between the carrier substrate and the conducting layers, which form the power planes and/or the electrical wires. As a result of this repeated thermal stress, the power planes/electrical wires tend to delaminate from the substrate, resulting in a failed structure, as discussed above.

Hichri et al. discloses in U.S. Patent Application Publication No. 2006/0190846, the entire contents of which are incorporated herein by reference, stacked via pillars provided to connect a base substrate to a top oxide cap such that a radial deformation of stacked conductive layers and low-k dielectric material fabricated between the base substrate and the top oxide cap are accommodated during thermal and mechanical stresses.

Edelstein et al. discloses in U.S. Patent Application Publication No. 2006/0027934, the entire contents of which are incorporated herein by reference, a carrier structure provided with through-vias, each through-via having a conductive structure with an effective coefficient of thermal expansion which is less than or closely matched to that of the substrate, to minimize the thermal stress.

SUMMARY OF THE INVENTION

According to one embodiment of the present invention, an electronic package includes a carrier substrate having first and second surfaces and a plurality of anchor vias having a via material extending from the first surface toward the second surface. The electronic package includes a first conducting layer having a length and a width extending laterally in two dimensions across a major part of the first surface of the carrier substrate. The anchor vias have plural attachments along the length and the width of the first conducting layer to secure the first conducting layer to the carrier substrate Still according to another embodiment of the present invention, an electronic package includes a carrier substrate having first and second surfaces and a plurality of first vias extending from the first surface to the second surface, a first set of conducting layers on the first surface of the substrate having a first length and a first width extending laterally in two dimensions across a major part of the first surface of the carrier substrate, plural dielectric layers disposed between respective ones of the first set of conducting layers to electrically isolate the respective ones from each other, and a first via conductor disposed in one of the first vias and connected to the first set of conducting layers.

According to still another embodiment of the present invention, a method for forming an electronic package includes providing a carrier substrate having first and second surfaces, forming in the carrier substrate a plurality of vias extending from the first surface, forming a first conducting layer having a length and a width extending laterally in two dimensions across a major part of the first surface of the carrier substrate, depositing via conductors in plural of the vias to connect the via conductors to the first conducting layer, and securing the first conducting layer to the carrier substrate with the plural via conductors.

According to another embodiment of the present invention, a method for reducing thermal fatigue failure due to heat cycling in an electronic package includes thermal cycling a conducting layer on a carrier substrate having a length and a width extending laterally in two dimensions across a major part of the first surface of the carrier substrate, and securing the conducting layer to the carrier substrate by plural via conductors disposed in plural of the vias, the via conductors connecting the conducting layer to the carrier substrate.

It is to be understood that both the foregoing general description of the invention and the following detailed description are exemplary, but are not restrictive of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
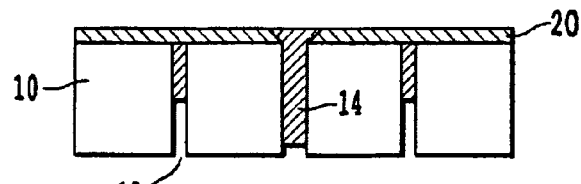
FIG. 1 is a diagram depicting a side view of an electronic package according to an embodiment of the invention.

Referring now to the drawings, wherein like reference numerals designate identical or corresponding parts throughout the several views, and more particularly to FIG. 1 thereof, FIG. 1 shows a side view through a carrier substrate 10 having at least a conducting layer 20 formed on a first main surface of the carrier substrate 10. Passive components (as capacitors, resistors, and inductors) may be formed within the carrier substrate.

According to an embodiment, the carrier substrate 10 is a silicon substrate and the conducting layer 20 is a copper layer. The conducting layer 20 may also be any known conductor material. The conducting layer 20 has good thermal and/or electrical properties. For example, in one embodiment, the substrate 10 is made of silicon that has a thermal conductivity of 149 W/m/K and a coefficient of thermal expansion of 2.6 $\mu$/m/K and the conducting layer 20 is made of copper that has a thermal conductivity of 401 W/m/K and a coefficient of thermal expansion of 16.5 $\mu$/m/K.

The conducting layer 20 is connected to at least a via conductor 14 formed in a via 12 thereby providing an anchor via. The anchor via can (for the purpose of illustration) be considered a rivet formed in the carrier substrate and in contact with the conducting layer 20 by which the conducting layer 20 maintains its structure under thermal stress. The carrier substrate 10, according to an embodiment, has one or plural vias 12. The vias can be through-vias or can be vias that extend from the first main surface but do not reach the opposing second main surface of the carrier substrate 10. As shown in FIG. 1, the via conductor 14 is formed to enter at least partially in the via 12 but the via conductor 14 does not necessarily have to go all the way through the via 12.

As such, the electronic package shown in FIG. 1 includes a carrier substrate 10 having first and second surfaces (e.g., the top and bottom surfaces of the carrier substrate) and a plurality of anchor vias (e.g., via conductor 14) having a via material extending from the first surface toward the second surface. The conducting layer 20 has a length and a width extending laterally in two dimensions across a major part of the first surface of the carrier substrate 10. The anchor vias form plural attachments (i.e., rivets) along the length and the width of the conducting layer 20 to secure the conducting layer 20 to the carrier substrate 10.

In one embodiment, the major part of the first surface covered by the conducting layer covers at least 10% of an entirety of the surface area of the carrier substrate. Typically, a signal line on a conventional PCB board would not occupy such a large area. In one embodiment, the major part of the first surface covered by the conducting layer covers at least 20% of an entirety of the surface area of the carrier substrate. At this coverage, especially for relatively thick conducting layers (e.g. greater than 10 microns), delamination without the rivet structure of the present invention is expected. Thus, for conducting layers such as a copper sheet 50 mm×50 mm which would serve as a power plane dissipating heat from mounted IC chips, the rivet structure permits the carrier substrate laminate of the invention to remain secure against thermal expansion and contraction stress. Furthermore, even if there are points of detachment at the interface between the conducting layer and the top surface of the carrier substrate, the anchor via maintain the utility of the carrier substrate laminate to continue to dissipate heat and be a viable support.

In one embodiment, the major part of the first surface covered by the conducting layer covers at least 90% of an entirety of the surface area of the carrier substrate. While the integrity of the carrier substrate laminate of the invention remains in tact for even higher area coverage, design rules will likely in practice never be as high as 100%.

Figure 5:
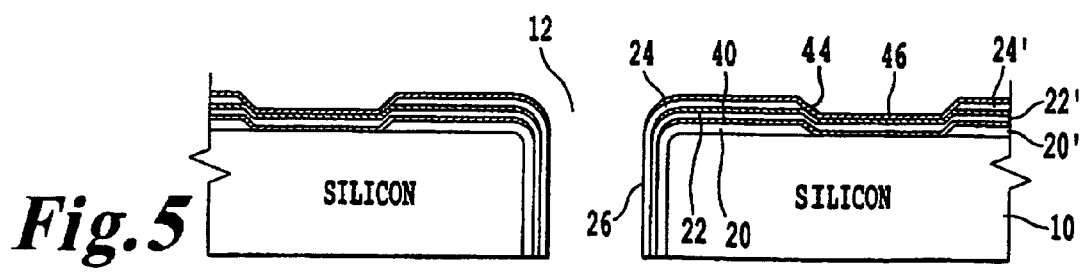
FIG. 5 is a diagram depicting a side view of the electronic package according to an embodiment of the invention.
Figure 6A:
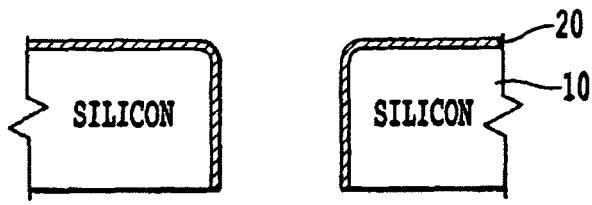
FIG. 6 is a diagram depicting steps in one embodiment of the invention for making a metallized via through the carrier substrate of the electronic package.
Figure 6B:
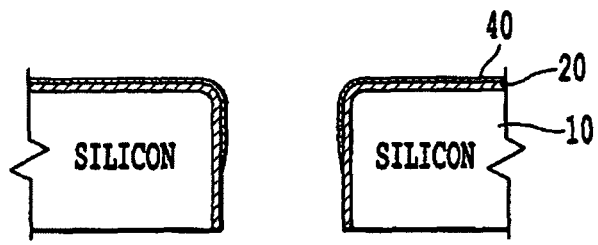
Figure 6C:
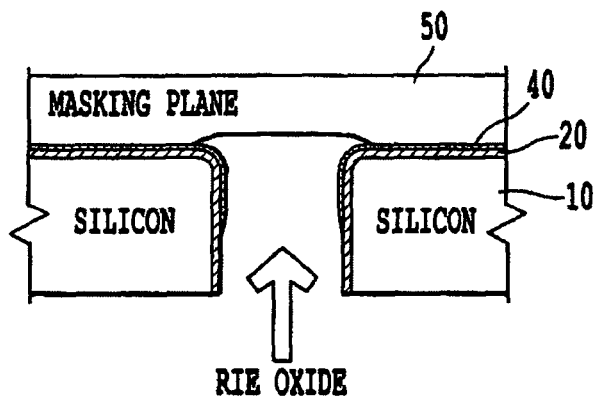
Figure 6D:
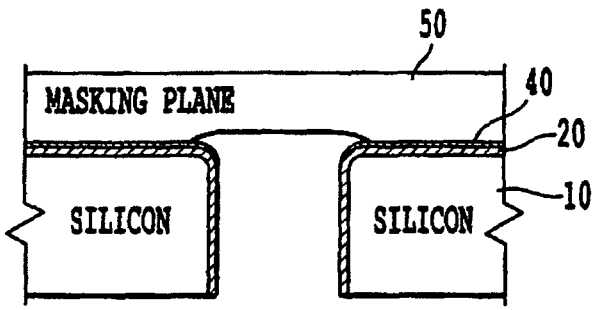

According to an embodiment, the via conductor 14 fills the via 12 or has an annular shape (see FIG. 5) such that a void inside the via is not filled by the via conductor 14. According to another embodiment, the void extends from the first main surface of the carrier substrate to the second main surface of the carrier substrate. Thus, in one embodiment, as illustrated in FIG. 1 by the incomplete depth wise fill and as illustrated in FIG. 5 by the incomplete annular fill, the via metals or the anchor vias do not occupy an entire volume of the vias etched in the carrier substrate. The via conductors can fill the vias between 10% and 100% in terms of the volume of the via.

The via conductor 14 may be formed of copper, aluminum, gold, silver or other conductors. The via conductor 14 may also be formed of the same material as the conducting layer 20 and the via conductor and the conducting layer may be formed as a single structure. Optionally, the via conductor 14 and the conducting layer 20 are formed in separate process steps out of a single material.

The conducting layer 20 and the via conductor 14 may be formed directly on the carrier substrate 10, i.e., with only an insulating layer between the conducting layer and the carrier substrate. The conducting layer 20 and the plural via conductors 14 can be formed to be a unitary, single, monolithic structure made of a same conducting material.

Figure 2:
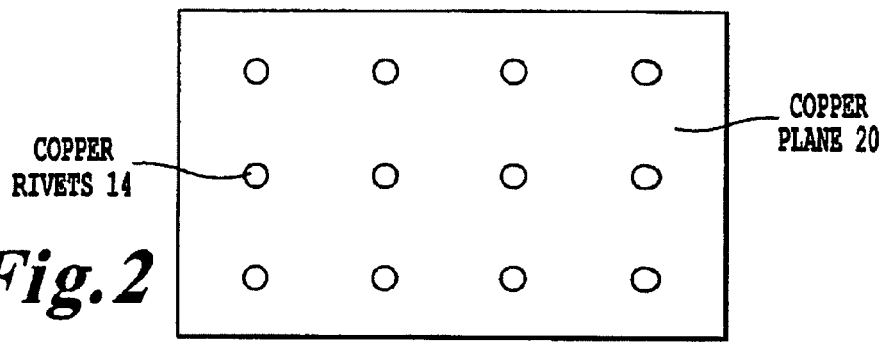
FIG. 2 is a diagram depicting a top view of the electronic package according to an embodiment of the invention.

The via conductors can be distributed relative to the conducting layer 20 in a pattern as shown for example in FIG. 2.

Other distribution patterns and irregular distribution patterns are also permissible and may be needed to accommodate chip attachment. The vias 12 can have a diameter between 30 and 150 µm. A distance between the via conductors is between 60 and 1000 µm. A density of the via conductors in the pattern is between 0.01 and 400 via conductors per unit square millimeter.

This density of the via conductors can be uniform across the entire conducting layer 20. Thus, for a conducting layer having approximate sizes of 140 mm by 80 mm, the number of via conductors can reach 100,000 per conducting layer. The number of via conductors for the above noted size of the conducting layer 20 has a minimum of 5000 and a maximum of 200,000.

Figure 3:
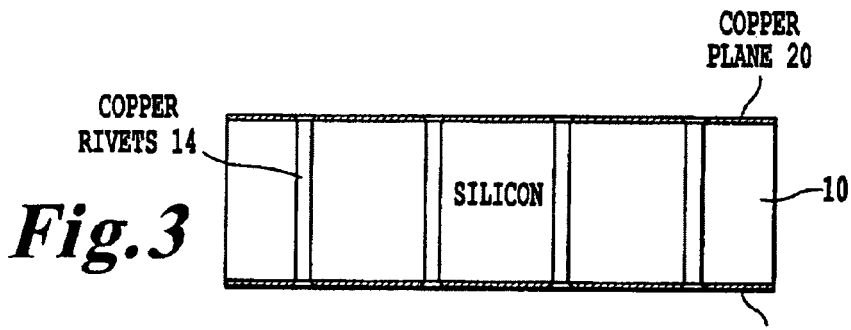
FIG. 3 is a diagram depicting a side view of the electronic package according to another embodiment of the invention.

According to an embodiment, another conducting layer 30 is formed on the second main surface of the carrier substrate 10, as shown in FIG. 3. The conducting layer 30 can have the same or different area coverage as described above with regard to conductive layer 20. The conductive layers 20 and 30 can be formed of the same material. In one embodiment, the conductive layers 20 and 30 and at least a via conductor 14 are formed of copper.

Figure 4:
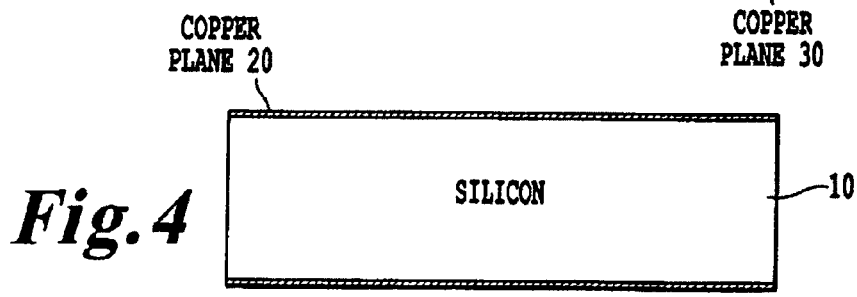
FIG. 4 is a diagram depicting a side view of the electronic package according to an embodiment of the invention.

In the embodiment shown in FIG. 3, the conducting layers 20 and 30 are mechanically connected by at least one via conductor 14, which acts as a rivet to hold the conducting layers 20 and 30 mechanically connected to the substrate. The conducting layers 20 and 30 can be connected by a plurality of via conductors 14 such that a stress caused by high changes in temperature in the main surfaces of the carrier substrate does not break the composite structure formed by the conducting layers and the via conductors. FIG. 4 shows a side view of the conducting layers 20 and 30 formed on the first and second main surfaces of the carrier substrate 10 with no via conductors in this particular cross section.

A size of the conducting layer 20 can be as long as 300 mm in one direction and 300 mm in another direction. It is noted that the conducting layer 20 can have a square shape or a shape that is not square, for example a rectangular shape. It is also noted that a conducting layer having sizes on the order of tens of centimeters expands larger than a substrate of silicon, thus generating a large thermal stress, which is more severe than conventional copper on silicon structures that have centimeter and subcentimeter sizes.

A structure having a large (centimeters to tens of centimeters) conducting layer having multiple via conductors connected to the large conducting layer, advantageously preserves the integrity of the structure because of the multiple via conductors that anchor the conducting layer to the carrier substrate. The structure having conducting layers 20 and 30 mechanically connected by the plural via conductors (as rivets) to the carrier substrate also permits the conducting structure to be reliable, less prone to delaminating, and to continue to function as designed even if delamination occurs, as discussed above with regard to the area coverage.

The structure of the conducting layer 20, the via conductors 14, and optionally the conducting layer 30 can be formed of a same material during a same step to provide a monolithic structure that is able to function even when the structure or one of its elements delaminate (or partially delaminates) from the carrier substrate 10.

In another embodiment of the invention shown in FIG. 5, the via technology presented above is used to form sets of electrically conducting layers on a carrier substrate for an electronic package. In this embodiment, the electronic package includes a carrier substrate 10 having first and second surfaces and a plurality of vias 12 extending from the first surface to the second surface. A first set of first conducting layers 20, 22, and 24 are formed on, for example, the top surface of the substrate 10 as shown in FIG. 5. Plural dielectric layers 40, 42, and 44 are disposed between respective ones of the first set of conducting layers 20, 22, and 24 to electrically isolate the respective ones of the first conducting layers from each other. A first via conductor 26 is disposed in one of the vias 12 and connected to the first set of conducting layers 20, 22, and 24. However, a set of via conductors is provided for each layer that has a large area of conductor to anchor the layer to the carrier structure.

As seen in FIG. 5, in one embodiment of the present invention, via conductor 26 (and for that matter via conductor 14 in FIG. 1) can have a volume less than a volume of the via in which the via conductor is formed, as discussed above. The via patterns, sizes, materials, and densities in the embodiment of FIG. 5 can be similar to those discussed above.

Accordingly, a plurality of additional vias (not shown in FIG. 5 for the sake of simplicity) are disposed in the carrier substrate 10 and extend from the top surface to the bottom surface (also not shown in FIG. 5 for the sake of simplicity). It is noted that the two conducting layers 20 and 24 can be electrically discontinued. In other words, insulating layers (dielectric layers) are formed between opposing ends of the first set of conducting layers (20, 22, and 24) and a second set of conducting layers (20', 22', and 24'), in the common plane in which the layers are formed. 21. Insulating layers formed are between opposing ends of the first and second sets of conducting layers.

Thus, the conducting layer 20 has two regions 20 and 20' electrically discontinued that can be supplied with different signals/electrical potentials. The same is true for any of the conducting layers. For example, the conducting layer 24 has two regions 24 and 24' electrically discontinued by the dielectric layer 44. It is also noted that the conducting layers 20, 22, and 24 shown in FIG. 5 have as a common root layer 26. Layer 26 can be made of the same material as layers 20, 22, and 24 in one embodiment.

Any number of conducting layers can be formed on the same main surface of the carrier substrate 10 and a corresponding number of dielectric layers. The dielectric layers can include silicon oxide, or any other appropriate insulating material as would be recognized by one of ordinary skill in the art (e.g. BCB (Benzocyclobutene) or low-k dielectrics (carbon doped $SiO_2$ or porous $SiO_2$) or high-k dielectrics). One or more conducting layers can be formed on the second main surface of the carrier substrate 10. The one or more conducting layers formed on the second main surface of the carrier substrate 10 can have the structure of the conducting layers 20, 22, and 24 discussed with regard to FIG. 5 or the structure of the conducting layer 20 discussed with regard to FIGS. 1-4.

The conducting layers 20', 22' and 24' can be connected to one or many second via conductors (not shown) similar to the via conductor 14 and thus, the conducting layers 20', 22' and 24' can be supplied with a control signal/electrical potential independent of the control signal/electrical potential supplied to layers 20, 22, and 24. It is noted that the dielectric layers 40, 42, and 44 do not necessarily enter the via 12 in one embodiment.

The above discussed structures in FIGS. 1-5 can be part of an electronic package for a filed programmable gate array (FPGA), a microprocessor, application-specific integrated circuit (ASIC), a plurality of FPGAs, ASICs, or microprocessors or any combination of active elements.

The vias 12 can be formed in the carrier substrate 10 by well know techniques, as for example Reactive Ions Etching (RIE) using the Bosch process. The Bosch process consists of a series of alternating passivation and etch steps. In the passivation step, a $C_4F_8$-based plasma is used to conformally deposit a thin layer of PTFE-like fluorocarbon polymer across all surfaces exposed to the plasma. In the first portion of the etch step, an $SF_6$-based plasma is used to etch the polymer preferentially on the wafer surface. This preferential etching is achieved through the application of a DC bias to the plate on which the wafer is positioned which leads to the increased ion energy in the vertical direction. In the second portion of the etch, the same plasma is used to etch the silicon surface at the base of the opening in the mask. The fluorocarbon polymer protects the vertical walls of the trench from etching.

By repeating the passivation/etch cycles, the process achieves the highly anisotropic etching of deep structures in silicon. The conducting layers and the via conductors can be formed by metal organic chemical vapor deposition, sputtering, PECVD (plasma enhanced chemical vapor deposition) or electrodeposition. The dielectric layers between the conducting layers can be formed by sputtering or other known methods.

When a through-wafer-via is formed in the carrier substrate and then the conducting and the dielectric materials are formed by sputtering, some of the material will cover the upper portion of the walls of the via. However, the oxide from the lateral walls of the via can be removed to achieve the structure shown in FIG. 5 discussed above. Further, a transition of the dielectric layer from the horizontal surface to a vertical surface inside the via can be smooth.

FIG. 6 is a diagram depicting steps to obtain the above discussed device. The carrier substrate 10 has a metallization layer 20 (e.g., Cu or other conductive material) deposited in mostly a conformal manner across the substrate surface and the interior wall surfaces of the vias 12. An oxide layer 40 such as a sputtered oxide is formed on the metallization layer 20. A masking plate 50 as shown in FIG. 6 is placed over the via 12. The masking plate 50 protects a chuck holding the wafer in a RIE chamber from damage and permits the cavity in the masking plate to expose a portion of the surface of the wafer to the RIE plasma. Suitable masking plate materials include copper. Following the RIE process, a smooth rounded edge of the via and the dielectric layer can be achieved. It is preferred that the smooth round edge has a radius on the order of the thickness of the copper or greater.

As shown in FIG. 6, the mask is aligned on the via such that the cavity of the mask is located directly over the via. In one embodiment, holes are formed in the mask, and the mask is aligned over the via by verifying that light enters the via from the hole of the mask. The mask plate can have different sizes and shapes of the cavities, including no cavity at all to accommodate different edge shapes if necessary. The mask can be held in place by a thin glue or a mechanical clamp. With the mask in place, RIE is performed with the mask on until a desired shape of the edge of the via or of the dielectric layer is achieved.

This process of providing smooth edges alleviates the development of stress in the corner regions where the via metal material transitions from the vias to the top surface conducting planes. These areas, especially for the embodiments with multi-layer dielectric and metallization as shown in FIG. 5, are prone to thermal stress induced failure over the lifetime of the electronics package due to repeated thermal cycling of the part during many typical operations e.g., a telecom system going from no traffic to full traffic may rapidly change its junction temperature.

Figure 7:
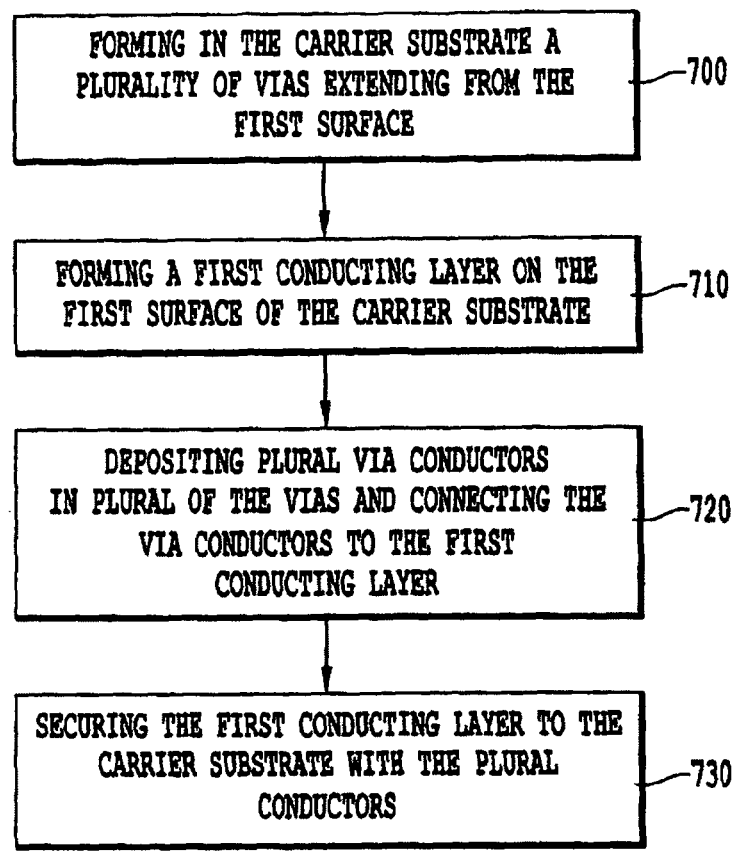
FIG. 7 is a flowchart illustrating one method for producing the electronic package of the present invention.

As shown in FIG. 7, a method for producing the above discussed devices, which are illustrated for example in FIGS. 1, 3, and 4, includes a step 700 of forming in the carrier substrate a plurality of vias extending from the first surface, a step 710 of forming a first conducting layer on the first surface of the carrier substrate, a step 720 of depositing a pattern of via conductors disposed in a predetermined number of vias and collectively connected to the first conducting layer, and a step 730 of securing the first conducting layer to the carrier substrate with the pattern of via conductors against thermal expansion and contraction thereof. The vias are produced in the carrier substrate using the RIE with the Bosch process described above. In step 710, a thermal oxide layer may be grown over the carrier substrate and the vias and this layer generates a smooth edge of the vias. In step 720, copper may be deposited with the MOCVD (metalorganic vapour phase epitaxy) process over the thermal oxide layer. A seed layer may be deposited with MOCVD or equivalent processes prior to depositing the copper.

Figure 8:
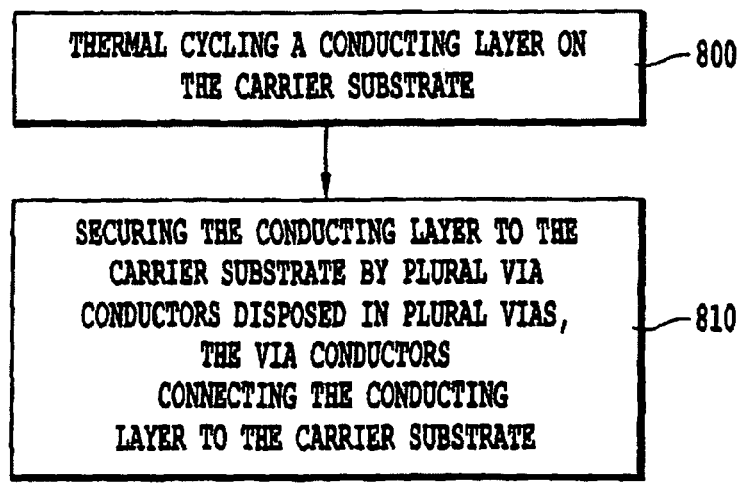
FIG. 8 is a flowchart illustrating one method for using an electronic package according to one embodiment of the present invention.

FIG. 8 is a flowchart illustrating one method for one of the electronic packages of the present invention. The method for reducing thermal fatigue failure due to heat cycling in the electronic package includes a step 800 of thermal cycling a conducting layer on the carrier substrate, and a step 810 of securing the conducting layer to the carrier substrate by a pattern of via conductors disposed in a predetermined number of vias, the via conductors collectively connecting the conducting layer to the carrier substrate. The electronic package discussed with reference to FIG. 8 may be the device shown in FIG. 1.

Figure 9:
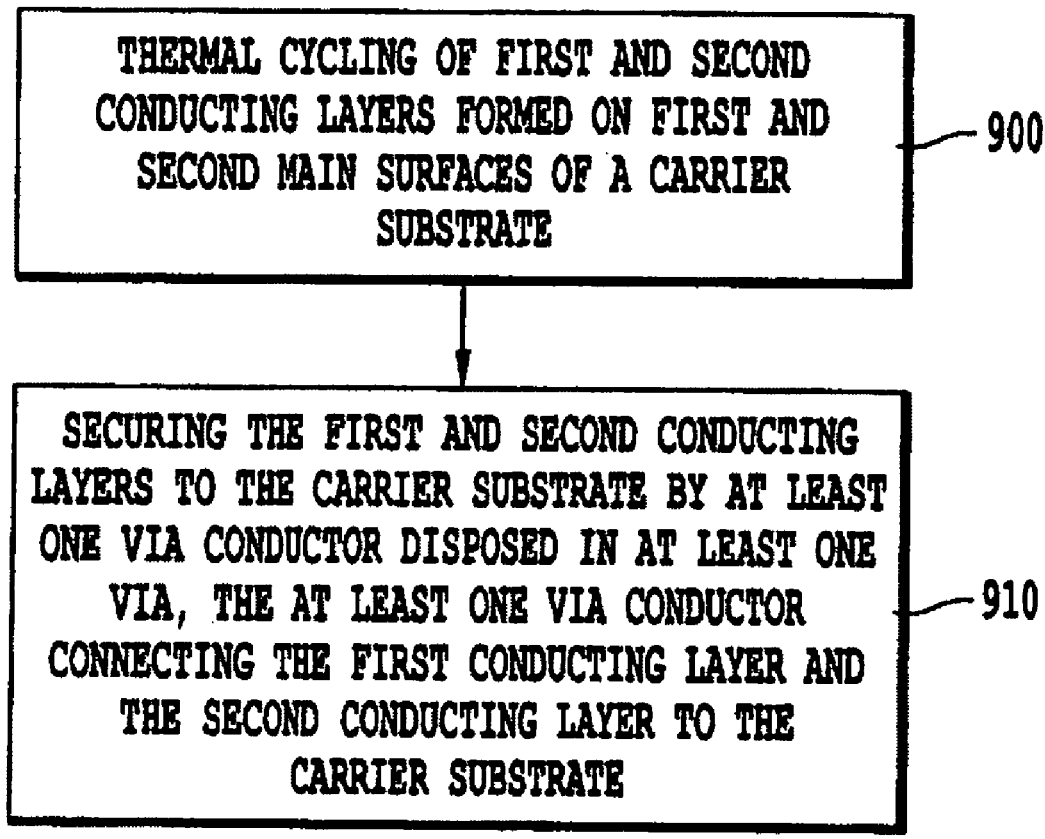
FIG. 9 is a flowchart illustrating another method for using another electronic package of the present invention.

FIG. 9 is a flowchart illustrating one method of use for another of the electronic packages of the present invention. The method for reducing thermal fatigue failure due to heat cycling in the electronic package includes a step 900 of thermal cycling of first and second conducting layers formed on first and second main surfaces of a carrier substrate, and a step 910 of securing the first and second conducting layers to the carrier substrate by at least one via conductor disposed in at least one via, the at least one via conductor connecting the first conducting layer to the second conducting layer with the carrier substrate between the first and second conducting layers. The electronic package discussed with reference to FIG. 9 may be the device shown in FIG. 3.

Numerous modifications and variations of the present invention are possible in light of the above teachings. It is therefore to be understood that within the scope of the appended claims, the invention may be practiced otherwise than as specifically described herein.

The invention claimed is:

1. A method for forming an electronic package, comprising:
   providing a carrier substrate having first and second surfaces;
   forming in the carrier substrate a plurality of vias extending from the first surface;
   forming a first conducting layer having a length and a width extending laterally in two dimensions across a major part of the first surface of the carrier substrate; and
   depositing at least one via material into the vias to connect the plural via materials to the first conducting layer and secure the first conducting layer to the carrier substrate, wherein a void inside the vias remains unfilled by the via materials.

2. The method of claim 1, wherein depositing comprises forming the via materials which extend to the second surface.

3. The method of claim 1, further comprising:
   forming a second conducting layer on the second surface of the carrier substrate such that a part of the via materials connect to the second conducting layer.

4. A method for forming an electronic package, comprising:
- providing a carrier substrate having first and second surfaces;
- forming in the carrier substrate a plurality of vias extending from the first surface;
- forming a first conducting layer having a length and a width extending laterally in two dimensions across a major part of the first surface of the carrier substrate;
- depositing at least one via material into the vias to connect the plural via materials to the first conducting layer and secure the first conducting layer to the carrier substrate; and
- depositing a dielectric layer between the carrier substrate and the first conducting layer.

5. The method of claim 4, wherein forming a first conducting layer includes forming a set of first conducting layers on the first surface of the substrate, and wherein depositing a dielectric layer includes depositing plural dielectric layers disposed between respective ones of the set of conducting layers to electrically isolate the respective ones of the first conducting layers from each other.

6. The method of claim 4, further comprising:
placing a masking plate over at least one of the vias.

7. The method of claim 6, further comprising:
etching at least a via conductor formed in the at least one of the vias to smooth an edge of the via conductor.

8. The method of claim 7, wherein forming a first conducting layer includes forming a first set of conducting layers on the first surface of the substrate, and wherein depositing at least one via material comprises depositing a first via conductor in one of the vias to connect to at least one conducting layer of the first set of conducting layers.

9. The method of claim 1, wherein forming a first conducting layer comprises forming the first conducting layer across at least 10% of an entirety of a surface area of the carrier substrate.

10. The method of claim 1, wherein forming a first conducting layer comprises forming the first conducting layer across at least 20% of an entirety of a surface area of the carrier substrate.

11. The method of claim 1, wherein forming a first conducting layer comprises forming the first conducting layer across at least 90% of an entirety of a surface area of the carrier substrate.

12. A method for reducing thermal fatigue failure due to heat cycling in an electronic package, comprising:
- thermal cycling a conducting layer on a carrier substrate that extends laterally in two dimensions across a major part of a surface of the carrier substrate; and
- securing the conducting layer to the carrier substrate by plural via materials disposed in plural vias, extending into the carrier substrate, and connecting the conducing layer to the carrier substrate at multiple attachments along the two dimensions.

13. The method of claim 12, wherein securing the conducting layer comprises securing the conducting layer across at least 10% of an entirety of a surface area of the carrier substrate.

14. The method of claim 12, wherein securing the conducting layer comprises securing the conducting layer across at least 20% of an entirety of a surface area of the carrier substrate.

15. The method of claim 12, wherein securing the conducting layer comprises securing the conducting layer across at least 90% of an entirety of a surface area of the carrier substrate.

16. The method of claim 4, wherein a void inside the vias remains unfilled by the via materials.

17. The method of claim 12, wherein a void inside the vias remains unfilled by the via materials.

* * * * *